United States Patent
Yoshigiwa

(10) Patent No.: US 11,043,520 B2
(45) Date of Patent: Jun. 22, 2021

(54) LIGHT-RECEIVING DEVICE, METHOD OF MANUFACTURING LIGHT-RECEIVING DEVICE, IMAGING DEVICE, AND ELECTRONIC APPARATUS

(71) Applicant: SONY SEMICONDUCTOR SOLUTIONS CORPORATION, Kanagawa (JP)

(72) Inventor: Jun Yoshigiwa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 193 days.

(21) Appl. No.: 16/329,890

(22) PCT Filed: Jul. 7, 2017

(86) PCT No.: PCT/JP2017/024983
§ 371 (c)(1),
(2) Date: Mar. 1, 2019

(87) PCT Pub. No.: WO2018/042886
PCT Pub. Date: Mar. 8, 2018

(65) Prior Publication Data
US 2019/0198547 A1 Jun. 27, 2019

(30) Foreign Application Priority Data
Sep. 2, 2016 (JP) .............................. JP2016-171959

(51) Int. Cl.
*H01L 27/146* (2006.01)
*H04N 5/369* (2011.01)
*H01L 31/0304* (2006.01)

(52) U.S. Cl.
CPC .... *H01L 27/14623* (2013.01); *H01L 27/1463* (2013.01); *H01L 27/1464* (2013.01);
(Continued)

(58) Field of Classification Search
IPC ................................................. H01L 27/14694
See application file for complete search history.

(56) References Cited

U.S. PATENT DOCUMENTS

| 2001/0013625 A1* | 8/2001 | Yu ........................ H01L 29/8611 257/355 |
| 2010/0006969 A1* | 1/2010 | Park .................. H01L 27/14621 257/446 |

(Continued)

FOREIGN PATENT DOCUMENTS

| JP | 2012-191135 | 10/2012 |
| JP | 2013-093385 | 5/2013 |

(Continued)

OTHER PUBLICATIONS

International Search Report prepared by the Japan Patent Office dated Sep. 6, 2017, for International Application No. PCT/JP2017/024983.

*Primary Examiner* — Mounir S Amer
(74) *Attorney, Agent, or Firm* — Sheridan Ross P.C.

(57) ABSTRACT

Provided is a light-receiving device including: a photoelectric conversion layer including a Group III-V semiconductor; a plurality of first electrically-conductive type regions in signal charges generated in the photoelectric conversion layer move; and a second electrically-conductive type region penetrating through the photoelectric conversion layer and provided between adjacent ones of the first electrically-conductive type regions.

20 Claims, 15 Drawing Sheets

(52) U.S. Cl.
CPC .. *H01L 27/14621* (2013.01); *H01L 27/14627* (2013.01); *H01L 27/14645* (2013.01); *H01L 27/14685* (2013.01); *H01L 27/14689* (2013.01); *H01L 27/14694* (2013.01); *H04N 5/369* (2013.01); *H01L 31/03044* (2013.01); *H01L 31/03046* (2013.01)

(56) References Cited

U.S. PATENT DOCUMENTS

| | | | |
|---|---|---|---|
| 2011/0019042 A1* | 1/2011 | Yamaguchi | H01L 27/307 348/280 |
| 2014/0175521 A1 | 6/2014 | Miyanami | |
| 2015/0048473 A1 | 2/2015 | Takahashi | |
| 2015/0091121 A1 | 4/2015 | Mande et al. | |
| 2016/0204156 A1* | 7/2016 | Togashi | H04N 5/3745 257/292 |

FOREIGN PATENT DOCUMENTS

| | | | | |
|---|---|---|---|---|
| JP | 2013-191869 | | 9/2013 | |
| JP | 2014-127514 | | 7/2014 | |
| JP | 2015-037154 | | 2/2015 | |
| JP | WO 2015/025723 | * | 2/2015 | ....... H01L 27/14636 |
| JP | 2015-070070 | | 4/2015 | |

\* cited by examiner

[FIG. 1]
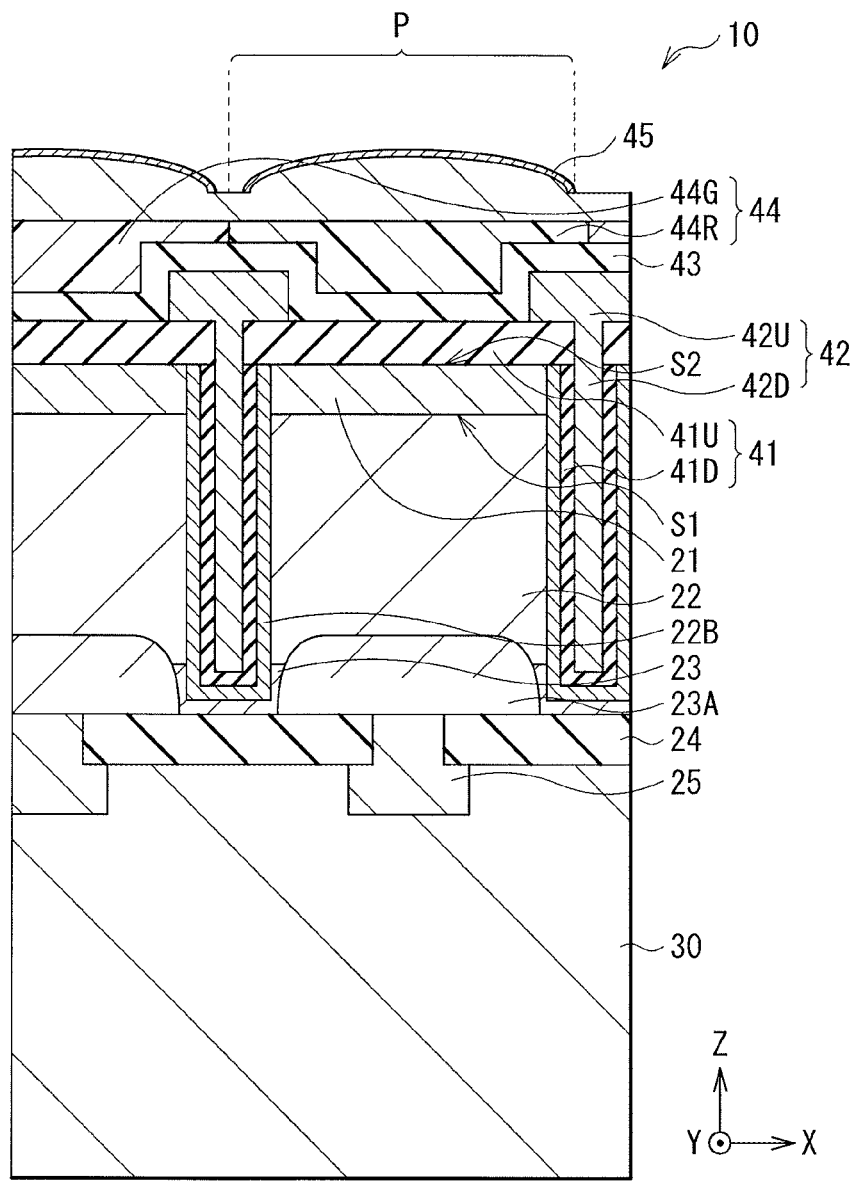

[ FIG. 2 ]
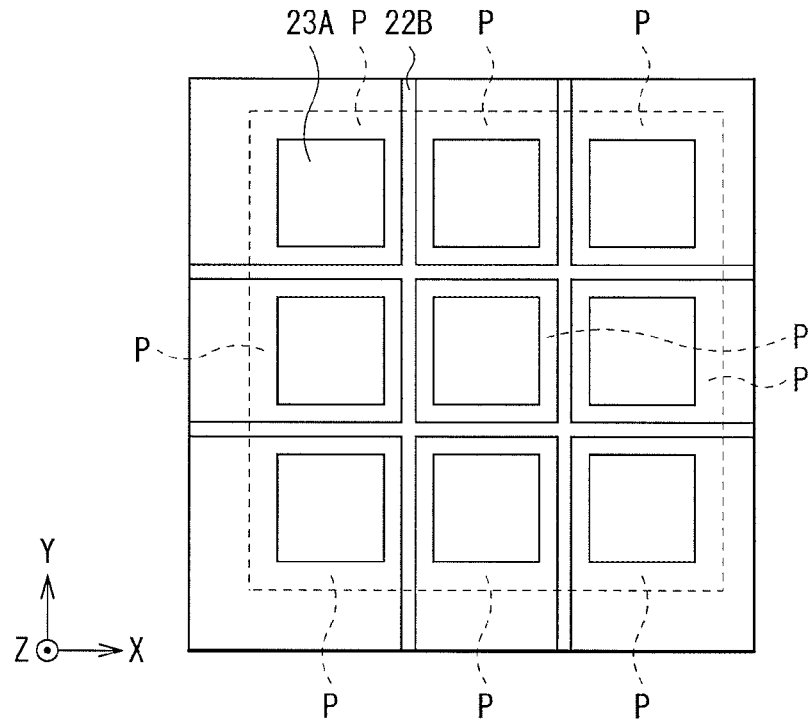
[ FIG. 3 ]
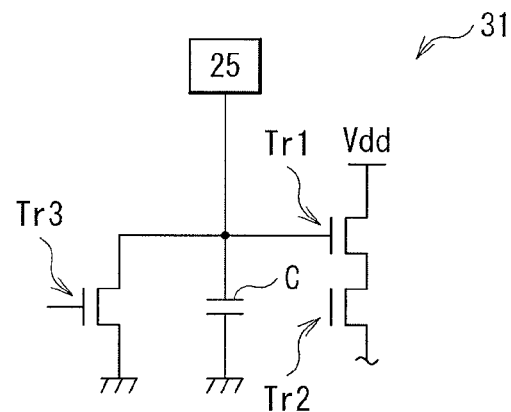

[ FIG. 4A ]
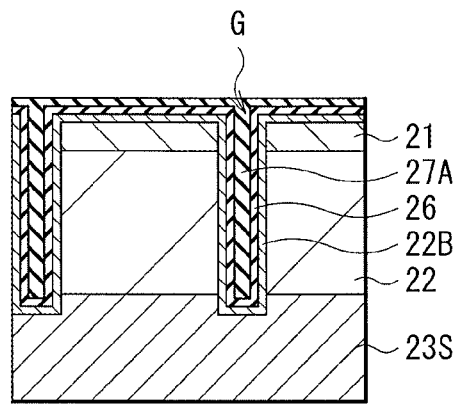
[ FIG. 4B ]
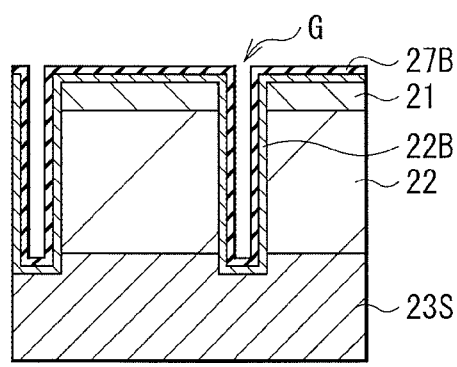
[ FIG. 4C ]
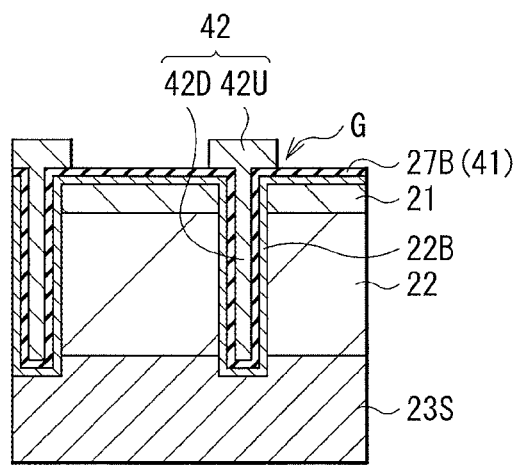

[ FIG. 5A ]
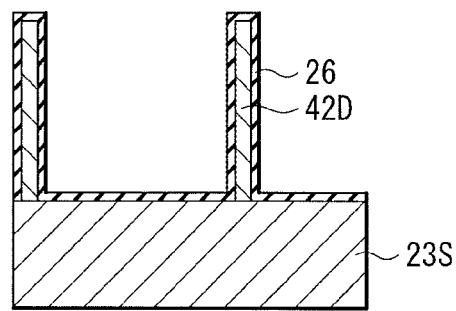
[ FIG. 5B ]
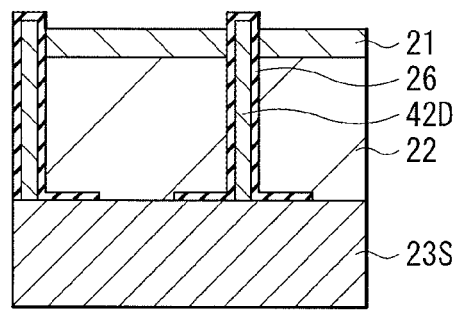
[ FIG. 5C ]
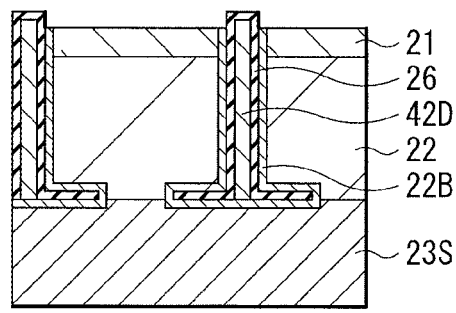

[FIG. 6]
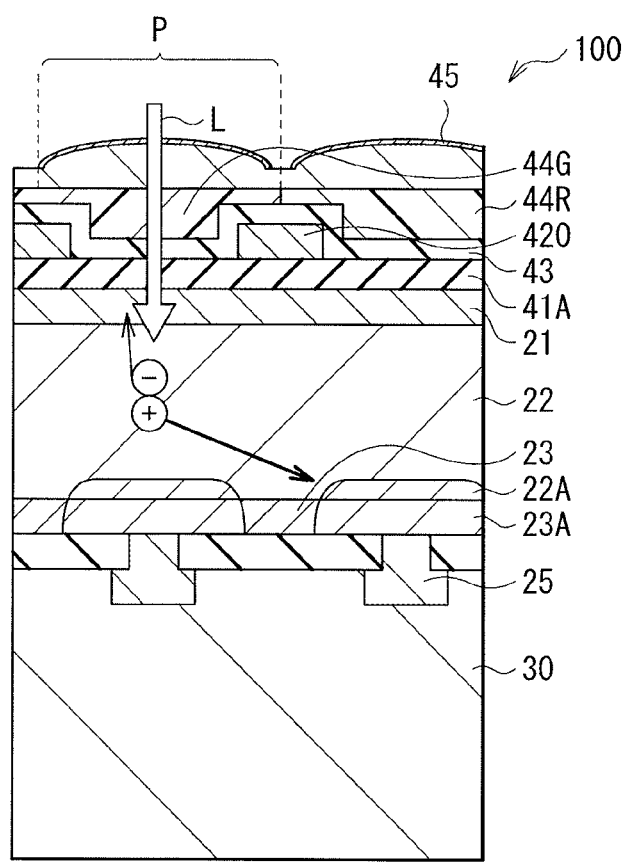

[ FIG. 7 ]
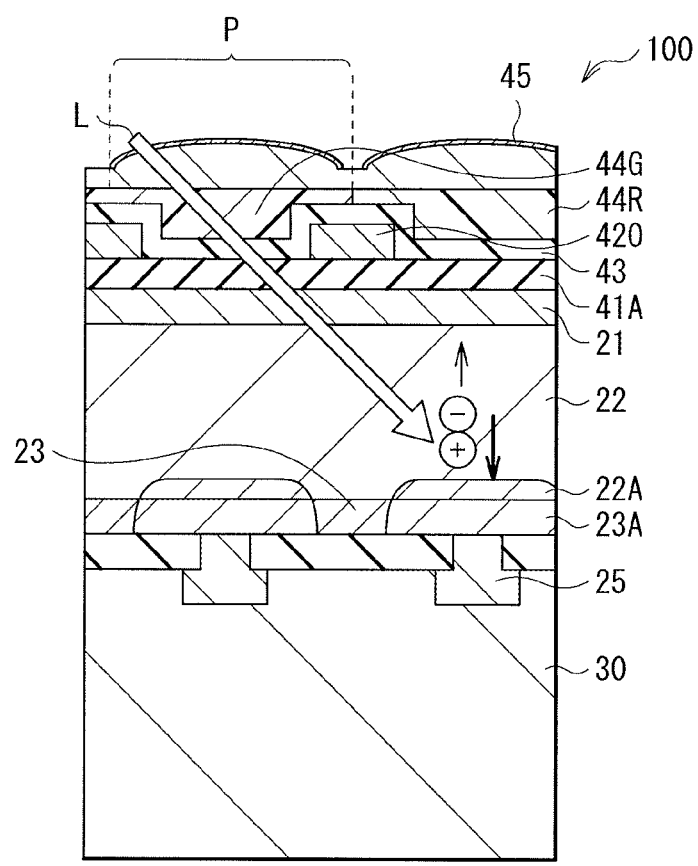

[ FIG. 8 ]
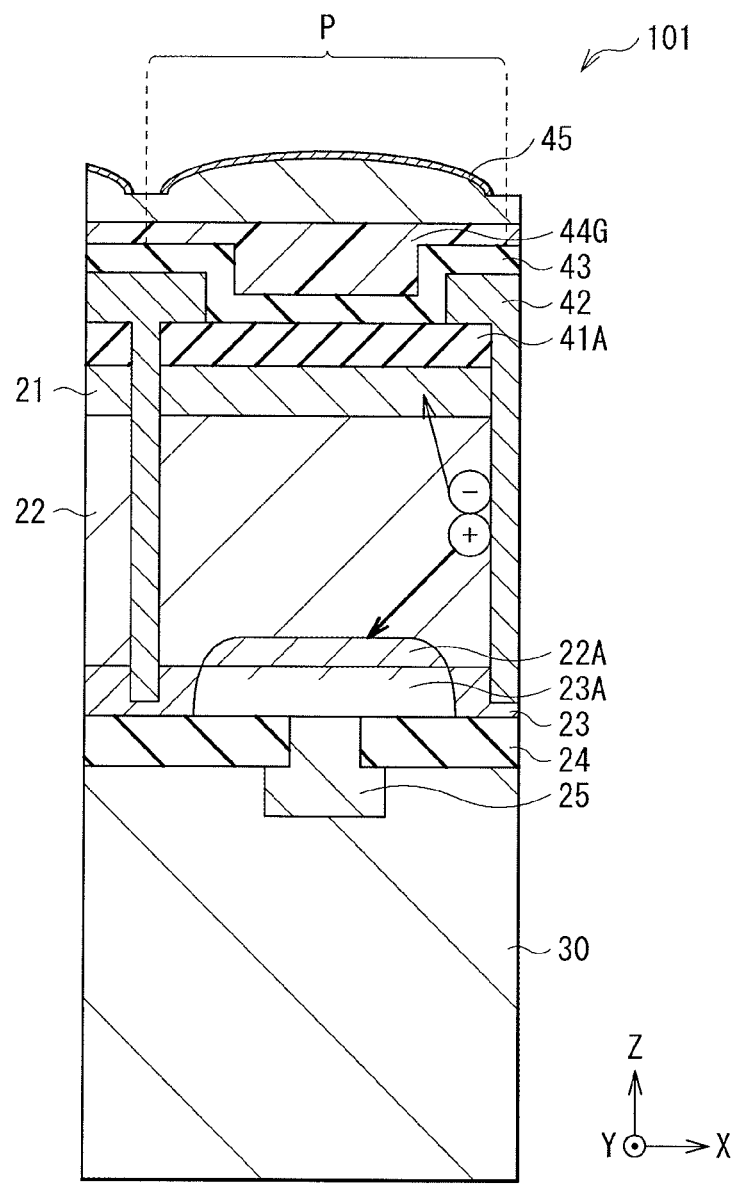

[ FIG. 9 ]
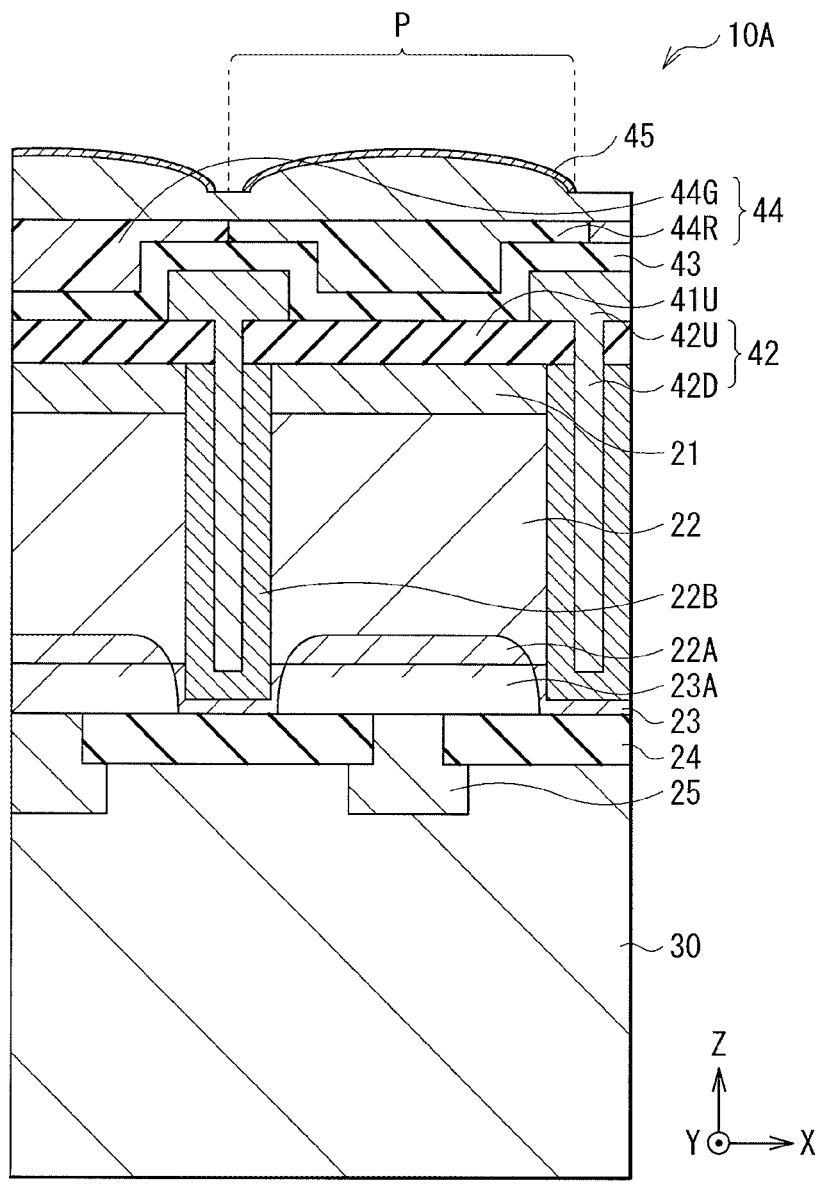

[ FIG. 10 ]
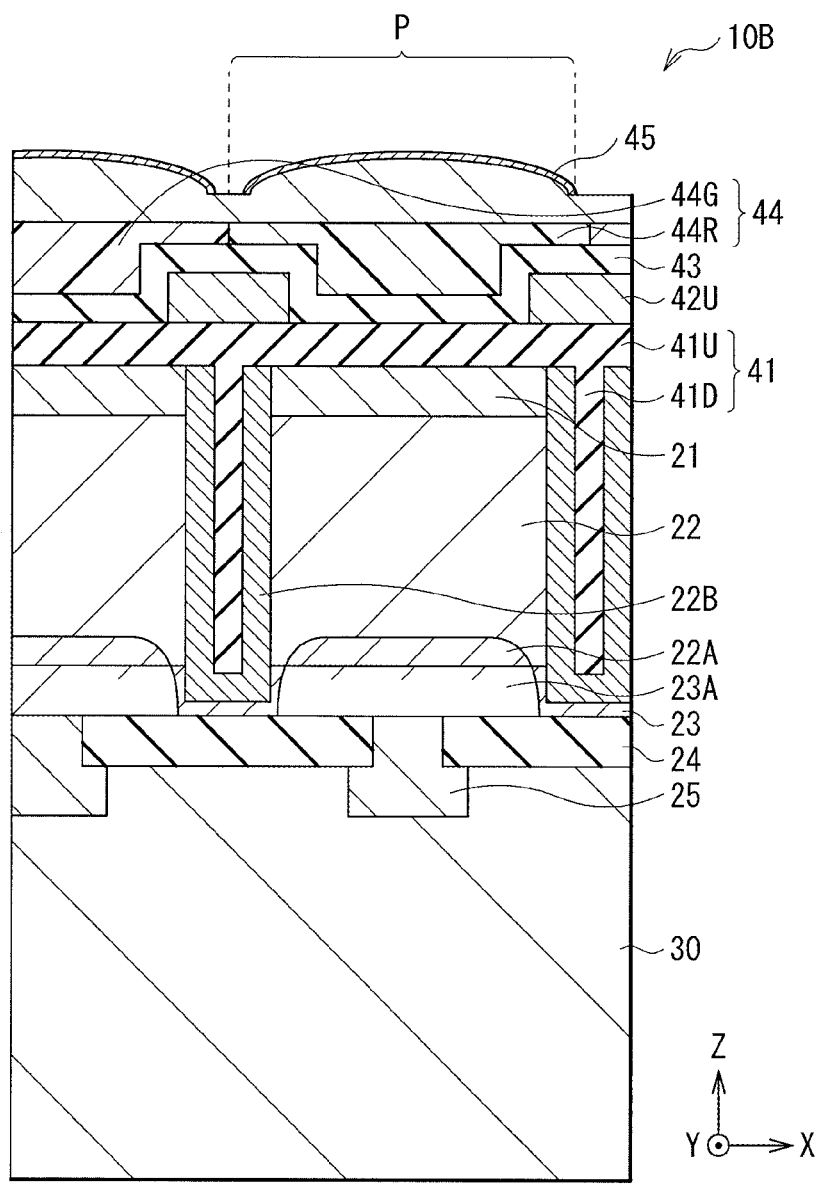

[ FIG. 11 ]
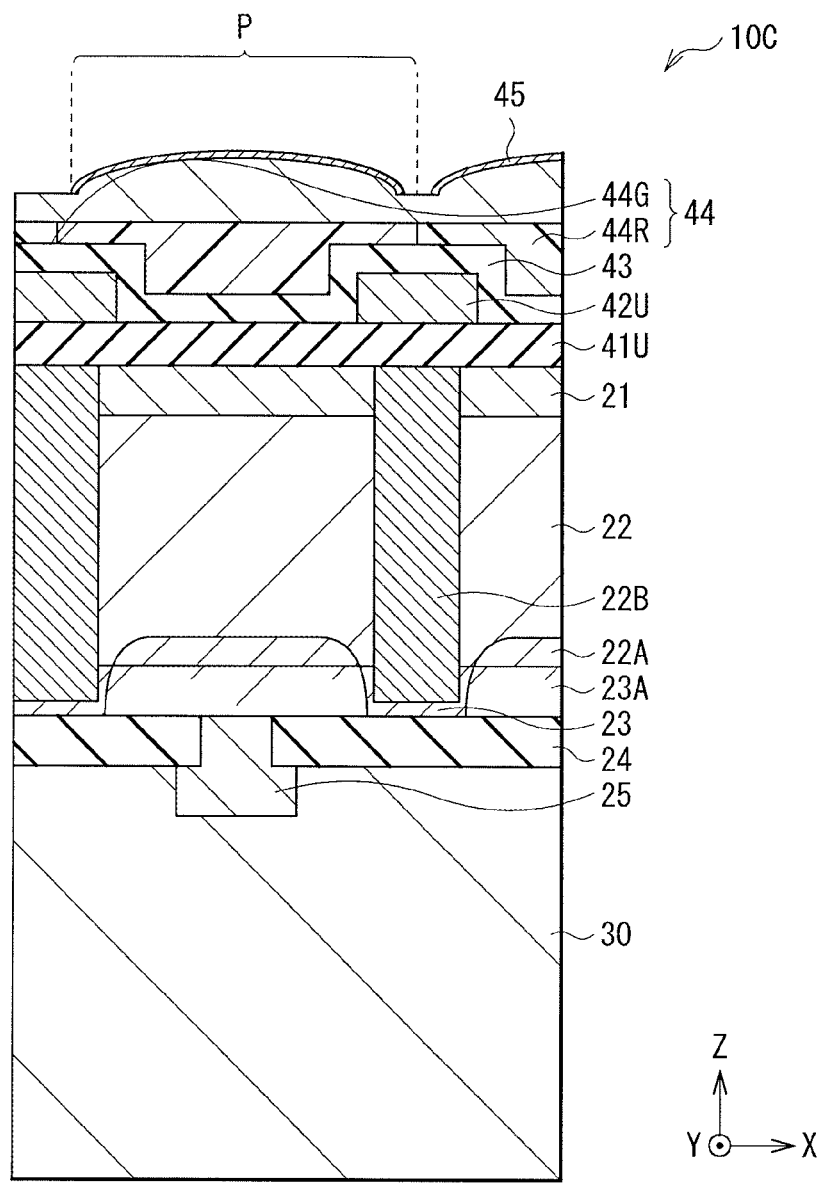

[ FIG. 12 ]
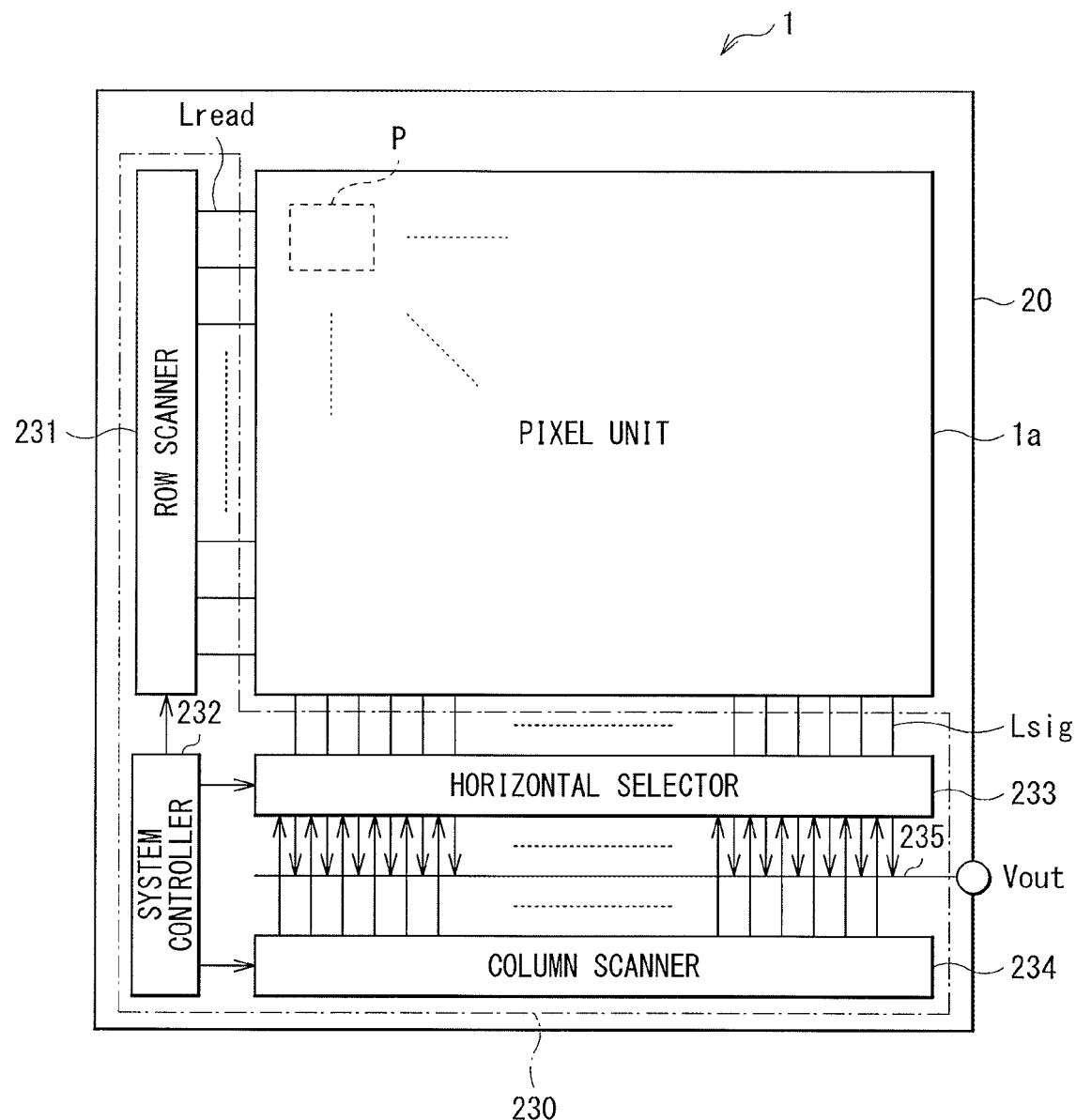

[ FIG. 13 ]
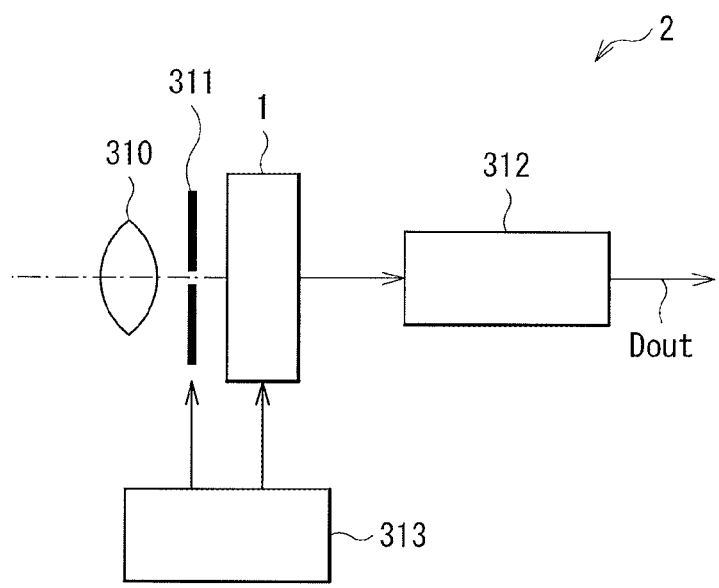

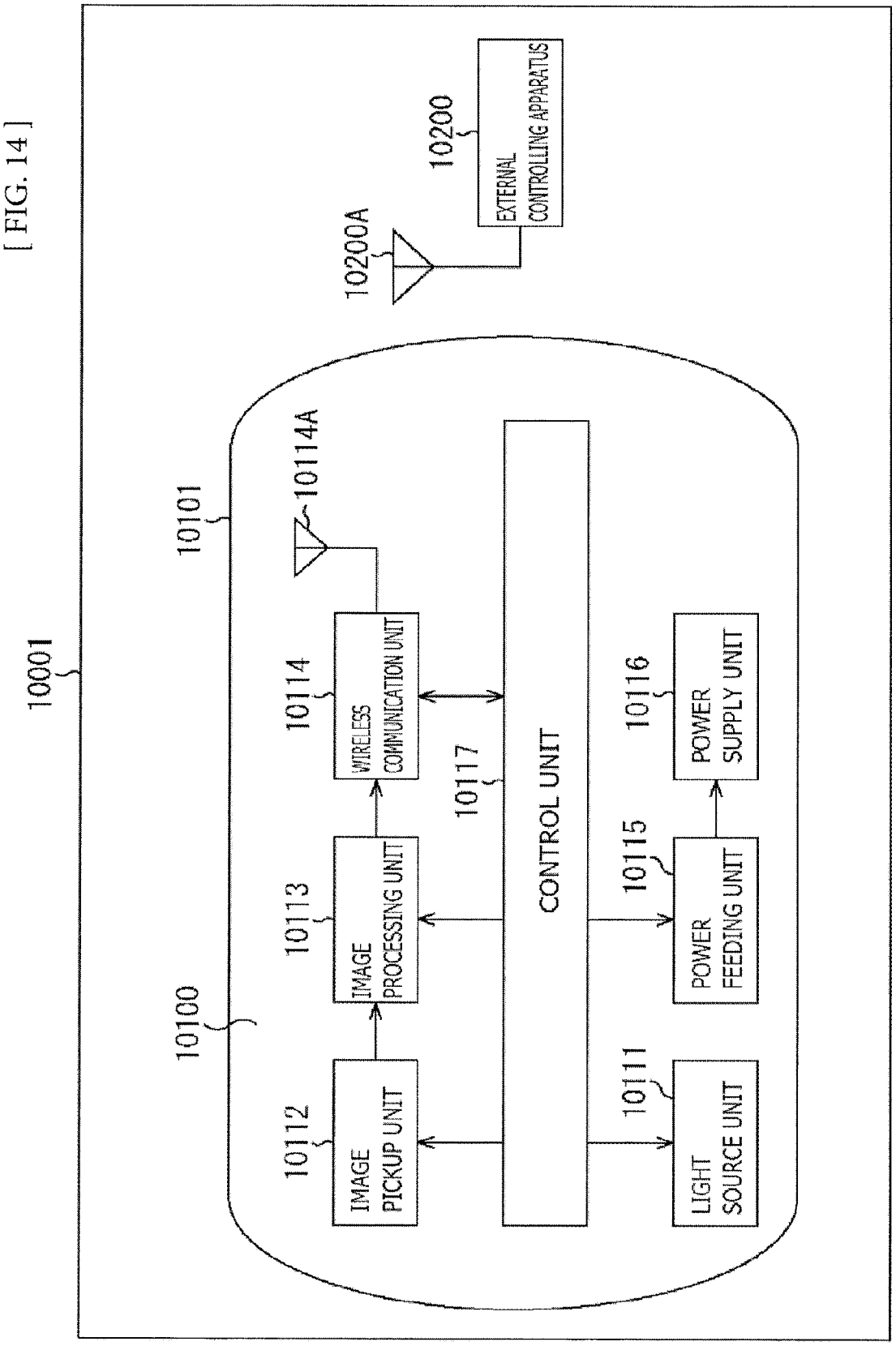

[FIG. 15]
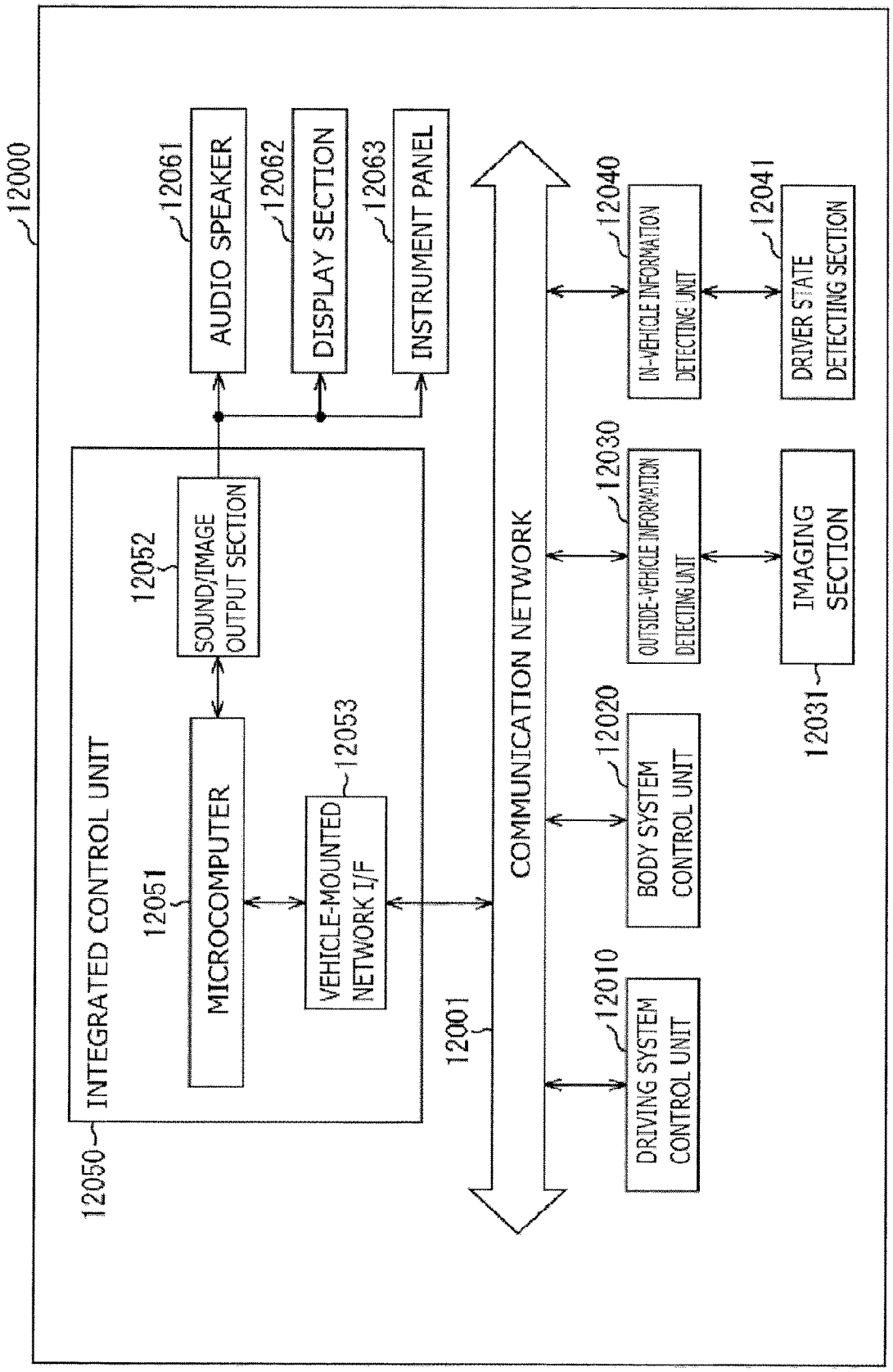

[ FIG. 16 ]
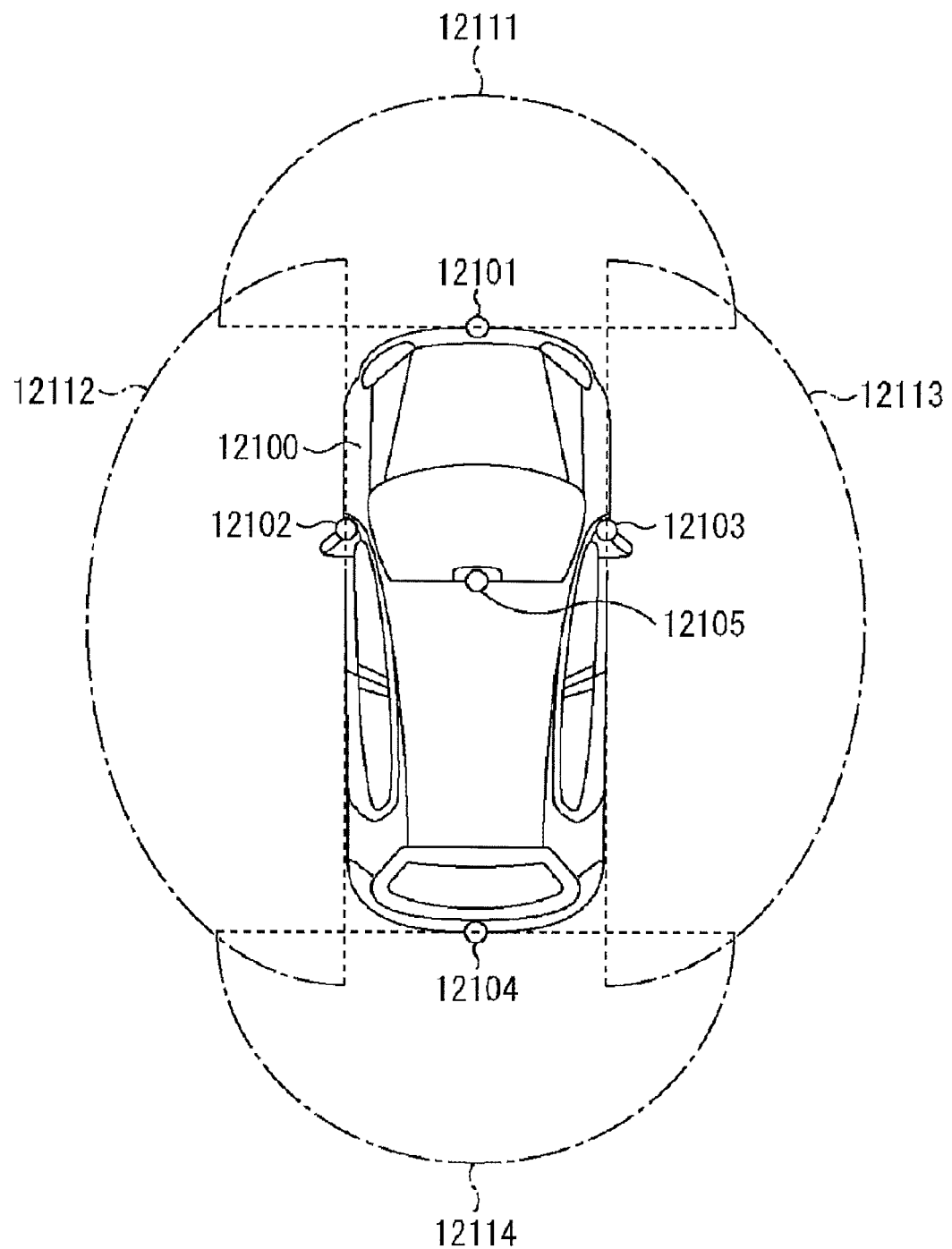

LIGHT-RECEIVING DEVICE, METHOD OF MANUFACTURING LIGHT-RECEIVING DEVICE, IMAGING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2017/024983 having an international filing date of 7 Jul. 2017, which designated the United States, which PCT application claimed the benefit of Japanese Patent Application No. 2016-171959 filed 2 Sep. 2016, the entire disclosures of each of which are incorporated herein by reference.

TECHNICAL FIELD

The present technology relates to a light-receiving device used for, for example, an infrared sensor, etc., and a method of manufacturing the same, and to an imaging device and an electronic apparatus.

BACKGROUND ART

In recent years, an image sensor (an imaging device) using, as a photoelectric conversion material, a Group III-V semiconductor such as InGaAs (indium gallium arsenide) has received attention (for example, refer to PTL 1). Such an image sensor is used as an infrared sensor having sensitivity in an infrared region, for example.

CITATION LIST

Patent Literature

PTL 1: Japanese Unexamined Patent Application Publication No. 2014-127499

SUMMARY OF THE INVENTION

A photoelectric conversion layer including a Group III-V semiconductor is provided as a common layer for respective pixels. In other words, the photoelectric conversion layer is provided continuously over the pixels. This may cause a pixel where light has entered to be different from a pixel from which signal charges generated in the photoelectric conversion layer are extracted. The signal charges are extracted in a first electrically-conductive type region provided for each of the pixels, for example.

It is desirable to provide a light-receiving device, a method of manufacturing a light-receiving device, an imaging device, and an electronic apparatus that make it possible to prevent movement of signal charges over pixels.

A light-receiving device according to the present technology includes: a photoelectric conversion layer including a Group III-V semiconductor; a plurality of first electrically-conductive type regions in which signal charges generated in the photoelectric conversion layer move; and a second electrically-conductive type region penetrating through the photoelectric conversion layer and provided between adjacent ones of the first electrically-conductive type regions.

A method of manufacturing a light-receiving device according to the present technology includes: forming a photoelectric conversion layer including a Group III-V semiconductor; forming a plurality of second electrically-conductive type regions penetrating through the photoelectric conversion layer; and forming, between adjacent ones of the second electrically-conductive type regions, a first electrically-conductive type region in which signal charges generated in the photoelectric conversion layer move.

An imaging device according to the present technology includes: a photoelectric conversion layer provided common to a plurality of pixels and including a Group III-V semiconductor; first electrically-conductive type regions each of which is provided for a corresponding one of the pixels, the first electrically-conductive type regions in which signal charges generated in the photoelectric conversion layer move; and a second electrically-conductive type region penetrating through the photoelectric conversion layer and provided between adjacent ones of the first electrically-conductive type regions.

An electronic apparatus according to the present technology includes the imaging device according to the present technology.

In the light-receiving device, the method of manufacturing the light-receiving device, the imaging device, and the electronic apparatus according to the present technology, the second electrically-conductive type region penetrating through the photoelectric conversion layer is provided; therefore, in a case where signal charges generated in the photoelectric conversion layer are about to move over the pixels, the signal charges are recombined in the second electrically-conductive type region.

According to the light-receiving device, the method of manufacturing the light-receiving device, the imaging device, and the electronic apparatus according to the present technology, the second electrically-conductive type region penetrating through the photoelectric conversion layer is provided, which makes u possible to prevent movement of signal charges over the pixels. It is to be noted that effects described here are not necessarily limited and may include any of effects described in the present disclosure.

BRIEF DESCRIPTION OF DRAWINGS

FIG. 1 is a cross-sectional view of a schematic configuration of a light-receiving device according to an embodiment of the present technology.

FIG. 2 is a plan view of a configuration of a second electrically-conductive type region illustrated in FIG. 1 together with a first electrically-conductive type region.

FIG. 3 is a circuit diagram illustrating an example of a ROIC provided in a multilayer wiring substrate illustrated in FIG. 1.

FIG. 4A is a schematic cross-sectional view of a process of a method of manufacturing the light-receiving device illustrated in FIG. 1.

FIG. 4B is a schematic cross-sectional view of a process following FIG. 4A.

FIG. 4C is a schematic cross-sectional view of a process following FIG. 4B.

FIG. 5A is a schematic cross-sectional view of a process of another method of manufacturing the light-receiving device illustrated in FIG. 1.

FIG. 5B is a schematic cross-sectional view of a process following FIG. 5A.

FIG. 5C is a schematic cross-sectional view of a process following FIG. 5B.

FIG. 6 is a cross-sectional view of a schematic configuration of a light-receiving device according to a comparative example 1.

FIG. 7 is a cross-sectional view for description of a case where oblique light enters the light-receiving device illustrated in FIG. 6.

FIG. 8 is a cross-sectional view of a schematic configuration of a light-receiving device according to a comparative example 2.

FIG. 9 is a cross-sectional view of a schematic configuration of a light-receiving device according to a modification example 1.

FIG. 10 is a cross-sectional view of a schematic configuration of a light-receiving device according to a modification example 2.

FIG. 11 is a cross-sectional view of a schematic configuration of a light-receiving device according to a modification example 3.

FIG. 12 is a diagram illustrating a schematic configuration of an imaging device including the light-receiving device illustrated in FIG. 1, etc.

FIG. 13 is a diagram illustrating a schematic configuration of an electronic apparatus to which the imaging device illustrated in FIG. 12 is applied.

FIG. 14 is a block diagram depicting an example of a schematic configuration of an in-vivo information acquisition system.

FIG. 15 is a block diagram depicting an example of schematic configuration of a vehicle control system.

FIG. 16 is a diagram of assistance in explaining an example of an installation position of an imaging section.

MODES FOR CARRYING OUT THE INVENTION

In the following, some embodiments of the present technology are described in detail with reference to the drawings. It is to be noted that description is given in the following order.

1. Embodiment (an example of a light-receiving device)
2. Modification Example 1 (an example in which a light-blocking structure is provided between pixels together with a second electrically-conductive type region)
3. Modification Example 2 (an example in which an insulating film is provided between pixels together with the second electrically-conductive type region)
4. Modification Example 3 (an example in which only the second electrically-conductive type region is provided between pixels)
5. Application Example 1 (an example of an imaging apparatus)
6. Application Example 2 (an example of an electronic apparatus)
7. Practical Application Example 1 (an example of an in-vivo information acquisition system)
8. Practical Application Example 2 (an example of a mobile body control system)

Embodiment

Configuration of Light-Receiving Device 10

FIG. 1 illustrates a cross-sectional configuration of a light-receiving device (a light-receiving device 10) according to an embodiment of the present technology. The light-receiving device 10 is applied to, for example, an infrared sensor, etc., and includes a plurality of light-receiving unit regions (serving as pixels P) that are two-dimensionally arranged.

The light-receiving device 10 includes a substrate 21, and a photoelectric conversion layer 22, a cap layer 23, a first protective layer 24, and a multilayer wiring substrate 30 are provided in this order on one surface (a surface S1) of the substrate 21. A first electrically-conductive type region 23A is provided for each of pixels P in the photoelectric conversion layer 22 and the cap layer 23. The light-receiving device 10 includes an electrode 25 penetrating through the first protective layer 24, and the first electrically-conductive type region 23A and a ROIC (Readout Integrated Circuit) of the multilayer wiring substrate 30 are electrically coupled to each other by the electrode 25. An insulating film 41, a light-blocking structure 42, a second protective layer 43, a color filter 44, and an on-chip lens 45 are provided in this order on another surface (a surface S2) of the substrate 21.

The substrate 21 includes, for example, a p-type or n-type compound semiconductor. For example, n-type InP (indium phosphide) is usable for the substrate 21. FIG. 1 illustrates a case where the photoelectric conversion layer 22 is provided in contact with the surface S1 of the substrate 21; however, another layer may be interposed between the substrate 21 and the photoelectric conversion layer 22. Examples of a material of the layer interposed between the substrate 21 and the photoelectric conversion layer 22 include semiconductor materials such as InAlAs, Ge, Si, GaAs, and InP, and it is preferable to select a material that is lattice-matched between the substrate 21 and the photoelectric conversion layer 22. The substrate 21 has a through hole between adjacent ones of the pixels P, and the through hole is filled with the insulating film 41 (an insulating film 41D to be described later) and the light-blocking structure 42 (a light-blocking structure 42D to be described later).

The photoelectric conversion layer 22 absorbs light with a predetermined wavelength (for example, light with a wavelength in an infrared region) to generate signal charges (electrons or holes), and includes a Group III-V semiconductor. The photoelectric conversion layer 22 is a common layer for the respective pixels P, and is provided continuously over the pixels P on the surface S1 of the substrate 21.

Examples of the Group III-V semiconductor used for the photoelectric conversion layer 22 include InGaAs (indium gallium arsenide). Examples of a composition of InGaAs include $In_xGa_{(1-x)}As$ (x: $0<x\leq1$). In order to enhance sensitivity in the infrared region, $x\geq0.4$ is preferable. One example of the composition of the photoelectric conversion layer 22 that is lattice-matched to the substrate 21 including InP is $In_{0.53}Ga_{0.47}As$.

The photoelectric conversion layer 22 includes, for example, an n-type (second electrically-conductive type) Group III-V semiconductor, and includes a Group IV element, a Group VI element, or the like that serves as an n-type impurity. Examples of the Group IV element include C (carbon), Si (silicon), Ge (germanium), and Sn (tin), and examples of the Group VI element include S (sulfur), Se (selenium), and Te (tellurium). A concentration of the n-type impurity is, for example, $2\times10^{17}/cm^3$ or less. The photoelectric conversion layer 22 may include a p-type (first electrically-conducive type) Group III-V semiconductor. The first electrically-conductive type region 23A is provided continuously from the cap layer 23 in a portion on a side on which the cap layer 23 is located of the photoelectric conversion layer 22.

In the present embodiment, a second electrically-conductive type region 22B penetrating through the photoelectric conversion layer 22 in a thickness direction (a Z direction in FIG. 1) is provided between adjacent ones of the first electrically-conductive type regions 23A. As described in detail later, this makes it possible to prevent movement of signal charges over the pixels P through the photoelectric conversion layer 22. The second electrically-conductive type region 22B extends, for example, from the photoelectric conversion layer 22 to the substrate 21 and the cap layer 23.

The second electrically-conductive type region 22B is, for example, an n-type impurity region having a higher concentration than another region of the photoelectric conversion layer 22. An imparity concentration in the second electrically-conductive type region 22B is preferably three or more times higher than an impurity concentration of the other region of the photoelectric conversion layer 22. The second electrically-conductive type region 22B includes, for example, a Group IV element, a Group VI element, or the like that serves as an n-type impurity. Examples of the Group IV element include C (carbon), Si (silicon), Ge (germanium), and Sn (tin), and examples of the Group VI element include S (sulfur), Se (selenium), and Te (tellurium). An n-type impurity concentration in the second electrically-conductive type region 22B is, for example, $5 \times 10^{16}/cm^3$ or more. The second electrically-conductive type region 22B has a width (a length in an X direction in FIG. 1) in a range from 30 nm to 500 nm, for example.

FIG. 2 illustrates an example of a planar configuration of the second electrically-conductive type region 22B. The second electrically-conductive type region 22B is provided between adjacent ones of the pixels P, and is provided in a grid pattern in plan view, for example.

A through hole continuous from the substrate 21 is provided is the photoelectric conversion layer 22 in proximity to the second electrically-conductive type region 22B, that, is, between adjacent ones of the pixels P, and the through hole is filled with the insulating film 41 (the insulating film 41D to be described later) and the light-blocking structure 42 (the light-blocking structure 42D to be described later).

The cap layer 23 is provided between the photoelectric conversion layer 22 and the first protective layer 24. The cap layer 23 includes the first electrically-conductive type region 23A provided for each of the pixels P, thereby causing the pixels to be electrically separated from one another. The cap layer 23 preferably includes a compound semiconductor having a larger band gap than the photoelectric conversion layer 22. For example, in a case where the photoelectric conversion layer 22 including $In_{0.53}Ga_{0.47}As$ (having a band gap of 0.74 eV) is used, it is possible for the cap layer 23 to include InP (having a band gap of 1.34 eV) or InAlAs (having a band gap of about 1.56 eV). A semiconductor laser may be interposed between the cap layer 23 and the photoelectric conversion layer 22. For example, it is possible to use InAlAs, Ge, Si, GaAs, InP, etc. for the semiconductor layer.

Two or more first electrically-conductive type regions 23A in the cap layer 23 are provided separately from one another for the respective pixels P. The first electrically-conductive type region 23A is a region in which signal charges generated in the photoelectric conversion layer 22 move, and is a region including a p-type impurity (a p-type impurity region), for example. The first electrically-conductive type region 23A includes a p-type impurity such as Zn (zinc). A region other than the first electrically-conductive type region 23A in the cap layer 23 is an n-type impurity region, and includes, for example, an n-type impurity such as a Group 14 element or a Group 16 element, as with the substrate 21. The first electrically-conductive type region 23A is provided to extend from a position in contact with the first protective layer 24 to a portion of the photoelectric conversion layer 22 in the thickness direction (the X direction in FIG. 1), for example. The first electrically-conductive type region 23A may not extend to the portion of the photoelectric conversion layer 22, and for example, may be provided to an interface between the cap layer 23 and the photoelectric conversion layer 22.

The first protective layer 24 is provided between the cap layer 23 and the multilayer wiring substrate 30, and includes, for example, an inorganic insulating material. Examples of the inorganic insulating material include silicon nitride (SiN), aluminum oxide ($Al_2O_3$), silicon oxide ($SiO_2$), hafnium oxide ($HfO_2$), etc. The first protective layer 24 has a through hole for each of the pixels P, and the electrode 25 is provided in the through hole.

The electrode 25 penetrates through the first protective layer 24, and, for example, a portion of the electrode 25 is embedded in the multilayer wiring substrate 30. The electrode 25 is provided for each of the pixels P, and is electrically coupled to a corresponding one of the first electrically-conductive type regions 23A and a corresponding one of ROICs (ROICs 31 to be described later) of the multilayer wiring substrate 30. The electrode 25 is supplied with a voltage for reading of signal charges generated in the photoelectric conversion layer 22. One electrode 25 may be provided for each of the pixels P, or a plurality of electrodes 25 may be provided for each of the pixels P. Some of the plurality of electrodes 25 provided for each of the pixels P may include a dummy electrode (an electrode that does not contribute to electric charge extraction).

The electrode 25 includes, for example, a simple substance of any of titanium (Ti), tungsten (W), titanium nitride (TiN), platinum (Pt), gold (Au), germanium (Ge), palladium (Pd), zinc (Zn), nickel (Ni), and aluminum (Al), or an alloy including at least one kind thereof. The electrode 25 may include a single-layer film including any of such constituent materials or a laminated film including a combination of two or more kinds thereof.

In the multilayer wiring substrate 30, the ROIC for signal reading from each of the pixels P is provided for each of the pixels P.

FIG. 3 illustrates an example of a circuit diagram of the ROIC (the ROIC 31). The ROIC 31 includes, for example, an amplification transistor Tr1, a select transistor Tr2, a reset transistor Tr3, and a retention capacitor C. A gate of the amplification transistor Tr1 is coupled to the electrode 25. A drain of the amplification transistor Tr1 is coupled to a supply terminal of a power source voltage Vdd, and a source of the amplification transistor Tr1 is coupled to a vertical signal line (not illustrated) through the select transistor Tr2. The amplification transistor Tr1 amplifies a potential of the electrode 25, and outputs a thus-amplified signal as a pixel signal to the select transistor Tr2. The select transistor Tr2 is provided between the amplification transistor Tr1 and the vertical signal line (not illustrated). The select transistor Tr1 is turned on upon inputting of an address signal to a gate of the select transistor Tr1 to output a pixel signal amplified by the amplification transistor Tr1 to the vertical signal line. A source of the reset transistor Tr3 is grounded, and a drain of the reset transistor Tr3 is coupled to the electrode 25. The reset transistor Tr3 is turned on upon inputting of a reset signal to a gate of the reset transistor Tr3 to reset the potential of the electrode 25. One electrode of the retention capacitor C is coupled to the electrode 25, and another electrode of the retention capacitor C is grounded.

The insulating film 41 includes an insulating film 41U provided on the surface S2 of the substrate 21, and the insulating film 41D embedded in the substrate 21 and the photoelectric conversion layer 22. The insulating film 41U is provided on the entire surface S2 of the substrate 21, and has a through hole between adjacent ones of the pixels P. The insulating film 41D is embedded in the through hole penetrating through the substrate 21 and the photoelectric conversion layer 22. The insulating film 41D has, for example, a planar shape similar to that of the second electrically-conductive type region 22B (refer to FIG. 2), and extends between the pixels P in a wall-like shape. This makes if possible to prevent movement of signal charges over the pixels P through the photoelectric conversion layer 22.

The insulating film 41 includes, for example, an inorganic insulating material. Examples of the inorganic insulating material include silicon nitride (SiN), aluminum oxide ($Al_2O_3$), silicon oxide ($SiO_2$), hafnium oxide ($HfO_2$), etc.

The light-blocking structure 42 prevents a crosstalk to an adjacent pixel by obliquely incident light. The light-blocking structure 42 includes a light-blocking structure 42U on the insulating film 41 and the light-blocking structure 42D embedded in the insulating film 41, the substrate 21, and the photoelectric conversion layer 22. Two or more light-blocking structures 42U are provided separately from one another in selective regions on the insulating film 41, and each of the light-blocking structures 42U is provided between adjacent ones of the pixels P. Light is allowed to enter the photoelectric conversion layer 22 from between adjacent ones of the light-blocking structures 42U. The light-blocking structure 42D is embedded in the through hole penetrating through the insulating film 41, the substrate 21, and the photoelectric conversion layer 22. The light-blocking structure 42D has, for example, a planar shape similar to that of the second electrically-conductive type region 22B (refer to FIG. 2) as with the insulating film 41D, and extends between the pixels P to a wall-like shape. This makes it possible to prevent movement of signal charges over the pixels P through the photoelectric conversion layer 22. Moreover, it is possible to more effectively prevent, together with the light-blocking structure 42U, the crosstalk to an adjacent pixel by obliquely incident light.

The light-blocking structure 42 includes, for example, metal such as titanium (Ti), tungsten (W), platinum (Pt), gold (Au), or chromium oxide ($Cr_2O_3$). The light-blocking structure 42 may include an alloy of samarium (Sm) and silver (Ag), or may include an organic material. Carbon (C) may be used for the light-blocking structure 42. The light-blocking structure 42 may include a single-layer film or a laminated film. Examples of the laminated film included in the light-blocking structure 42 include a metal laminated film such as Ti/W.

For example, the light-blocking structure 42D is provided in a center of the through hole in the photoelectric conversion layer 22, and the insulating film 41D is embedded on both surfaces of the light-blocking structure 42D. A region in contact with the initiating film 41D of the photoelectric conversion layer 22 serves as the second electrically-conductive type region 22B, for example. In other words, the second electrically-conductive type region 22B is provided on both sides of the through hole (the light-blocking structure 42D) in the photoelectric conversion layer 22. As illustrated in FIG. 1, a portion of the light-blocking structure 42D and a portion of the Insulating film 41D may be embedded in the cap layer 23.

The second protective layer is provided on the entire surface S2 of the substrate 21 to cover the insulating film 41U and the light-blocking structure 42U. The second protective layer 43 includes, for example, an inorganic insulating material, as with the first protective layer 24. Examples of the inorganic insulating material include silicon nitride (SiN), aluminum oxide ($Al_2O_3$), silicon oxide ($SiO_2$), hafnium oxide ($HfO_2$), etc.

The color filter 44 is provided on the second protective layer 43, and includes, for example, a red filter (a red filter 44R), a green filter (a green filter 44G), a blue filter (not illustrated), and an IR filter (not illustrated). In the light-receiving device 10, for example, these filters each provided for a corresponding one of the pixels P are arranged in a regular color arrangement (for example, a Bayer arrangement). Providing such a color filter 44 causes the light-receiving device 10 to obtain data of received light with a wavelength corresponding to the color arrangement.

The on-chip lens 45 has a function of concentrating light toward the photoelectric conversion layer 22, and includes, for example, an organic material, a silicon oxide film ($SiO_2$), or the like.

Method of Manufacturing Light-Receiving Device 10

It is possible to manufacture the light-receiving device 10 in the following manner, for example. FIGS. 4A to 4C illustrate processes of manufacturing the light-receiving device 10 in process order.

First, a stacked body of compound semiconductors is formed. Specifically, for example, a stacked body that includes the substrate 21 including n-type InP, the photoelectric conversion layer 22 including n-type InGaAS, and a cap layer precursor 23S including n-type InP is formed. The cap layer precursor 23S is a compound semiconductor layer that becomes the cap layer 23. It is possible to form the stacked body by, for example, an epitaxy method such as MBE (Molecular Beam Epitaxy) and migration-enhanced epitaxy (MEE). The stacked body may be formed by a method such as a MOCVD (Metal Organic Chemical Vapor Deposition) method, a hydride vapor phase epitaxy method (HVPE method) in which a halogen contributes to transport or reaction, an ALD (Atomic Layer Deposition) method, or a plasma assisted physical deposition method (PPD method).

After the stacked body of the compound semiconductors is formed, a plurality of grooves G that penetrate through the substrate 21 and the photoelectric conversion layer 22 and reach inside the cap layer precursor 23S is formed. The grooves G are formed with use of a reactive ion etching (RIE) method, for example. The plurality of grooves G is formed at positions in regions between adjacent ones of the pixels P. Next, a diffusion source film 26 and a diffusion barrier film 27A are formed in this order in the grooves G. The diffusion source film 26 is a film used to introduce an n-type impurity into the photoelectric conversion layer 22, and includes, for example, amorphous silicon. The diffusion source film 26 may be a film including a Group IV element or a Group VI element that serves as another n-type impurity. Examples of the Group IV element include C (carbon), Si (silicon), Ge (germanium), and Sn (tin), and examples of the Group VI element include S (sulfur), Se (selenium), and Te (tellurium). The diffusion barrier film 27A includes, for example, a silicon oxide film ($SiO_2$). The diffusion barrier film 27A is formed to prevent diffusion of the n-type impurity from the diffusion source film 26 to outside, and is formed to cover the diffusion source film 26. The diffusion source film 26 and the diffusion barrier film 27A are formed by, for example, a chemical vapor deposition (CVD) method.

After the diffusion barrier film 27A is formed, short-time heat treatment is performed to introduce the n-type impurity into peripheries of the grooves G. This heat treatment is performed at 850° C. for 1 second, for example. Thus, for example, the second electrically-conductive type region 22B having a surface impurity density of about $1\times10^{13}/cm^2$ is formed around the grooves G (FIG. 4A). It is to be noted for an impurity diffusion method using amorphous silicon, it is possible to refer to Appl. Phys. Lett. Vol. 44(1984) p. 750.

After the short-time heat treatment is performed, in order to prevent excessive impurity diffusion, the diffusion source film 26 together with the diffusion barrier film 27A is etched to be removed. Next, a diffusion barrier film 27B including, for example, a silicon oxide film ($SiO_2$) is formed in the grooves G, and thereafter, long-time heat treatment is performed. This heat treatment is performed at 900° C. for three hours, for example. Thus, the n-type impurity is spread into the peripheries of the grooves G to form the second electrically-conductive type region 22B having a desired width (FIG. 4B). The heat treatment may be performed at 1100° C. for about ten minutes. The second electrically-conductive type region 22B may be formed by vapor-phase diffusion other than a solid-phase diffusion method described above, or may be formed by ion implantation.

The diffusion barrier film 27B previously formed may be used as the insulating film 41, or the insulating film 41 may be formed on the diffusion barrier film 27B by a CVD method, for example. The insulating film 41 may be formed after the diffusion barrier film 27B is removed.

It is possible to form the second electrically-conductive type region 22B with use of a method illustrated in FIGS. 5A to 5C.

Specifically, first, for example, a film of tungsten is formed on the cap layer precursor 23S, and is patterned, thereby forming the light-blocking structures 42D. Next, the diffusion source film 26 including, for example, amorphous silicon is formed on the cap layer precursor 23S, and to cover the light-blocking structures 42D (FIG. 5A).

Next, an opening is formed in the diffusion source film 26. The opening of the diffusion source film 26 is formed between the light-blocking structures 42D, that is, in a central portion of each of the pixels P. Next, for example, a film of n-type InGaAs and a film, of n-type InP are formed in this order from the opening of the diffusion source film 26 as a starting point. Thus, the photoelectric conversion layer 22 and the substrate 21 are formed on the cap layer precursor 23S (FIG. 5B).

Thereafter, heat treatment is performed. Thus, an n-type impurity is diffused from the diffusion source film 26 to the photoelectric conversion layer 22 in proximity to the diffusion source film 26 to form the second electrically-conductive type region 22B (FIG. 5C). Next, the insulating film 41U is formed on the substrate 21. It is to be noted that although not illustrated, the insulating film 41D in the photoelectric conversion layer 22 may be formed after formation of the light-blocking structure 42D and before formation of the diffusion source film 26.

After the insulating film 41 is formed, for example, tungsten is embedded in the grooves G and a film is formed on the substrate 21. Next, tungsten on the substrate 21 is patterned. Thus, the light-blocking structure 42U on the substrate 21 and the light-blocking structure 42D in the photoelectric conversion layer 22 are formed (FIG. 4C).

After the light-blocking structure 42 (the light-blocking structures 42U and 42D) is formed, the cap layer precursor 23S is thinned. Next, a p-type impurity is diffused in a selective region of the thinned cap layer precursor 23S. Thus, the cap layer 23 having the first electrically-conductive type region 23A is formed.

After the cap layer 23 is formed, the first protective layer 24 and the electrode 25 are formed. Subsequently, the multilayer wiring substrate 30 is bonded to the cap layer 23 with the first protective layer 24 interposed therebetween.

Next, the second protective layer 43, the color filter 44, and the on-chip lens 45 are formed in this order on a side on which the surface S2 is located of the substrate 21. Thus, the light-receiving device 10 illustrated in FIG. 1 is completed.

Operation of Light-Receiving Device 10

In the light-receiving device 10, in a case where light (for example, light with a wavelength in the infrared region) enters the photoelectric conversion layer 22 through the on-chip lens 45, the color filter 44, the second protective layer 43, the insulating film 41, and the substrate 21, the light is absorbed in the photoelectric conversion layer 22. As a result a pair of a hole and an electron is generated in the photoelectric conversion layer 22 (the light is subjected to photoelectric conversion). At this time, for example, in a case where a predetermined voltage is applied to the electrode 25, a potential gradient is generated in the photoelectric conversion layer 22, and one charge of generated charges moves to the first electrically-conductive type region 23A as a signal charge, and is collected from the first electrically-conductive type region 23A to the electrode 25. The signal charge is read by the ROIC 31 of the multilayer wiring substrate 30. For the sake of convenience, a case where the signal charge is a hole is described below.

Workings and Effects of Light-Receiving Device 10

In the light-receiving device 10 according to the present embodiment, the second electrically-conductive type region 22B penetrating through the photoelectric conversion layer 22 is provided between adjacent ones of the first electrically-conductive type regions 23A, that is, between adjacent ones of the pixels P. The second electrically-conductive type region 22B is, for example, an n-type region having high concentration, and is a region including a high concentration of electrons. This makes it possible to prevent movement of signal charges (holes) over the pixels P. This is described below.

FIG. 6 illustrates a cross-sectional configuration of a light-receiving device (a light-receiving device 100) according to a comparative example. In the light-receiving device 100, the second electrically-conductive type region is not provided in the photoelectric conversion layer 22. In the light-receiving device 100, as with the light-receiving device 10, upon entry of light L, pairs of holes and electrons are generated in the photoelectric conversion layer 22, and the holes move to the first electrically-conductive type region 23A. However, the second electrically-conductive type region that separates the pixels P from one another is not provided, which may cause the holes to move to the pixel P different from the pixel P where the light L has entered through the photoelectric conversion layer 22. In other words, the holes may move over the pixels P to cause the pixel P where the light L has not entered to generate an optical signal. In a case where the light-receiving device 100 is used for an imaging device for color image, generation of such an optical signal in an adjacent pixel P affects color mixture characteristics. Moreover, resolution declines.

Moreover, as illustrated in FIG. 7, in a case where the obliquely incident light L enters over the pixels P, the photoelectric conversion layer 22 of the pixel P adjacent to the pixel P where the light L has entered may perform photoelectric conversion. Even in this case, an optical signal is generated in the adjacent pixel P in a manner similar to that described above.

A light-receiving device 101 illustrated in FIG. 8 includes the light-blocking structure 42D between adjacent ones of the pixels P in the photoelectric conversion layer 22. The light-receiving device 101 having a pixel separation structure such as the light-blocking structure 42D makes it possible to prevent movement of holes over the pixels P and a signal in the adjacent pixel P caused by oblique incident light. However, in a case where a compound semiconductor is processed to form the light-blocking structure 42D, a crystal defect (a defect level) occurs, or an interface level remains. Accordingly, even in a state in which light is not applied, holes may be generated at room temperature. In other words, a dark current may be generated.

In contrast, in the light-receiving device 10, the second electrically-conductive type region 22B penetrating through the photoelectric conversion layer 22 is provided between adjacent ones of the pixels P; therefore, holes that are about to move over the pixels P are recombined in the second electrically-conductive type region 22B having plenty of electrons. This makes it possible to prevent movement of holes over the pixels P. Accordingly, even in a case where the light-receiving device 10 is used for an imaging device for color image, it is possible to suppress occurrence of color mixture. Moreover, it is possible to improve resolution.

Moreover, the insulating film 41D and the light-blocking structure 42D are provided in the photoelectric conversion layer 22; therefore, the insulating film 41D and the light-blocking structure 42D serve as separation structures between the pixels P as with the second electrically-conductive type region 22B, thereby more effectively preventing movement of holes over the pixels P. Further, the light-blocking structure 42 in the photoelectric conversion layer 22 prevents generation of an optical signal in the adjacent pixel P caused by obliquely incident light.

In the light-receiving device 10, even if a defect level, an interface level, etc. occur upon formation of the insulating film 41D and the light-blocking structure 42D in such a photoelectric conversion layer 22, the second electrically-conductive type region 22B having a plenty of electrons is provided; therefore, these levels are always occupied by electrons. This makes it possible to prevent generation of pairs of holes and electrons through the levels and generation of a dark current.

As described above, in the present embodiment, the second electrically-conductive type region 22B penetrating through the photoelectric conversion layer 22 is provided between adjacent ones of the first electrically-conductive type regions 23A, which makes it possible to prevent movement of signal charges over the pixels P.

Hereinafter, description is given of modification examples and application examples of the foregoing embodiment, and same components as those in the foregoing embodiment are denoted by same reference numerals, and description thereof are omitted as appropriate.

Modification Example 1

FIG. 9 illustrates a cross-sectional configuration of a light-receiving device (a light-receiving device 10A) according to a modification example 1. In the light-receiving device 10A, the insulating film (the insulating film 41D in FIG. 1) is not provided in the photoelectric conversion layer 22. Except for this point, the light-receiving device 10A has a configuration similar to that of the light-receiving device 10, and workings and effects are also similar.

As with the light-receiving device 10, the light-receiving device 11A includes the light-blocking structure 42D in the photoelectric conversion layer 22, and the second electrically-conductive type region 22B is provided around the light-blocking structure 42D. In other words, a separation structure between the pixels P includes the second electrically-conductive type region 22B and the light-blocking structure 42D. As with the light-receiving device 10, such a light-receiving device 10A also prevents movement of signal charges over the pixels P. Moreover, the light-blocking structure 42 in the photoelectric conversion layer 22 prevents generation of an optical signal in the adjacent pixel P caused by obliquely incident light.

Modification Example 2

FIG. 10 illustrates a cross-sectional configuration of a light-receiving device (a light-receiving device 10B) according to a modification example 2. In the light-receiving device 10B, the light-blocking structure (the light-blocking structure 42D in FIG. 1) is not provided in the photoelectric conversion layer 22. Except for this point, the light-receiving device 10B has a configuration similar to that of the light-receiving device 10, and workings and effects thereof are also similar.

As with the light-receiving device 10, the light-receiving device 10B includes the insulating film 41D in the photoelectric conversion layer 22, and the second electrically-conductive type region 22B is provided around the insulating film 41D. In other words, a separation structure between the pixels P includes the second electrically-conductive type region 22B and the insulating film 41D. As with the light-receiving device 10, such a light-receiving device 10B also prevents movement of signal charges over the pixels P.

Modification Example 3

FIG. 11 illustrates a cross-sectional configuration of a light-receiving device (a light-receiving device 10C) according to a modification example 3. In the light-receiving device 10C, the insulating film (the insulating film 41D in FIG. 1) and the light-blocking structure (the light-blocking structure 42D in FIG. 1) are not provided in the photoelectric conversion layer 22. Except for this point, the light-receiving device 10C has a configuration similar to that of the light-receiving device 10, and workings and effects thereof are also similar.

In the light-receiving device 10C, adjacent ones of the pixels P are separated by the second electrically-conductive type region 22B. As with the light-receiving device 10, such a light-receiving device 10C also prevents movement of signal charges over the pixels P.

3. Application Examples

Application Example 1

FIG. 12 illustrates a functional configuration of an imaging device 1 using an device structure of the light-receiving device 10 (or any of the light-receiving devices 10A, 10B, and 10C) described in the foregoing embodiment, etc.

Examples of the imaging device 1 include an infrared image sensor, and the imaging device 1 includes, for example, a pixel unit 1a and a peripheral circuit unit 230 that drives the pixel unit 1a on a substrate 20. The peripheral circuit unit 230 includes, for example, a row scanner 231, a horizontal selector 233, a column scanner 234, and a system controller 232.

The pixel unit 1a includes a plurality of pixels P two-dimensionally arranged in a matrix, for example. For example, the pixels P are wired with pixel drive lines Lread (specifically, row selection lines and reset control lines) for respective pixel rows, and wired with vertical signal lines Lsig for respective pixel columns. The pixel drive lines Lread transmit drive signals for signal reading from the pixels P. The pixel drive lines each have one end coupled to a corresponding one of output terminals, corresponding to the respective rows, of the row scanner 231.

The row scanner 231 includes a shift register, an address decoder, etc. and serves as a pixel driver that drives the respective pixels P in the pixel unit 1a on a row-by-row basis, for example. A signal outputted from each of the pixels P of a pixel row selectively scanned by the row scanner 231 is supplied to the horizontal selector 233 through each of the vertical signal lines Lsig. The horizontal selector 233 includes an amplifier, a horizontal selection switch, etc. provided for each of the vertical signal lines Lsig.

The column scanner 234 includes a shift register, an address decoder, etc., and drives respective horizontal selection switches of the horizontal selector 233 in sequence while scanning the horizontal selection switches. Such selective scanning by the column scanner 234 causes the signals of the respective pixels transmitted through the respective vertical signal lines Lsig to be outputted in sequence to a horizontal signal line 235 and thereafter inputted to an unillustrated signal processor, etc. through the horizontal signal line 235.

The system controller 232 receives a clock given from outside or data etc. on instructions of operation modes, and also outputs data such as internal information of the imaging device 1. The system controller 232 further includes a timing generator that generates various timing signals, and performs drive control of the row scanner 231, the horizontal selector 233, the column scanner 234, etc., on the basis of the various timing signals generated by the timing generator.

Application Example 2

The foregoing imaging device 1 is applicable to various types of electronic apparatuses such as a camera that enables imaging of an infrared region, for example. FIG. 13 illustrates a schematic configuration of an electronic apparatus 2 (a camera) as an example. Examples of the electronic apparatus 2 include a camera that enables shooting of a still image or a moving image, and the electronic apparatus 2 includes the imaging device 1, an optical system (an optical lens) 310, a shutter apparatus 311, a driver 313 that drives the imaging device 1 and the shutter apparatus 311, and a signal processor 312.

The optical system 310 guides image light (incident light) from an object to the imaging device 1. The optical system 310 may include a plurality of optical lenses. The shutter apparatus 311 controls a period in which the imaging device 1 is irradiated with the light and a period in which the light is blocked. The driver 313 controls a transfer operation of the imaging device 1 and a shutter operation of the shutter apparatus 311. The signal processor 312 performs various types of signal processing on signals outputted from the imaging device 1. An image signal Dout having been subjected to the signal processing is stored in a storage medium such as a memory or outputted to a monitor, etc.

Furthermore, the light-receiving device 10A (or any of the light-receiving devices 10B, 10C, and 10D) described in the embodiment, etc. is applicable to the following electronic apparatuses (a capsule endoscope 10100, a mobile body of a vehicle, etc.).

Practical Application Example to In-Vivo Information Acquisition System

FIG. 14 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup junction and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 14, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a pruning apparatus not depicted) to output generated image data by printing.

The description has been given above of one example of the in-vivo information acquisition system, to which the technology according to the present disclosure is applicable. The technology according to the present disclosure may be applied to, for example, the image pickup unit 10112 of the configurations described above. This makes it possible to acquire a fine operative image, thereby improving accuracy of an inspection.

Practical Application Example to Mobile Body

The technology (present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, as airplane, a drone, a vessel, and a robot.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12050 is connected with an imaging section 12031. The outside-vehicle information detecting unit 12030 makes the imaging section 12031 image an image of the outside of the vehicle, and receives the imaged image. On the basis of the received image, the outside-vehicle information defecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside at outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance from a preceding vehicle to be maintained in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized, vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system, to which the technology according to the present disclosure is applicable. The technology according to the present disclosure may be applied to, for example, the imaging section 12031, etc. of the configurations described above. Applying the technology according to the present disclosure to the imaging section 12031 makes it possible to obtain a captured image which is easier to see. Hence, it is possible to reduce the fatigue of the driver.

Although the description has been given with reference to the embodiment and the modification examples, the present technology is not limited to the foregoing embodiment, etc., and may be modified in a variety of ways. For example, the layer configuration of any of the light-receiving devices described in the foregoing embodiment, etc. is illustrative, and may further include any other layer. Moreover, the materials and thicknesses of the respective layers are also illustrative and are not limited to those described above.

Further, the foregoing embodiment, etc. have been described with reference to the light-receiving device for color image including the color filter 14; however, the present technology is applicable to a light-receiving device other than the light-receiving device for color image. At this occasion, an insulating film may be provided in place of the color filter 44.

Furthermore, the foregoing embodiment, etc. have been described with reference to a case where the insulating film 41D and the light-blocking structure 42D penetrate through the photoelectric conversion layer 22 (for example, FIG. 1, etc.), the insulating film 41D and the light-blocking structure 42D may not necessarily penetrate through the photoelectric conversion layer 22.

It is to be noted that the effects described herein are merely illustrative and non-limiting, and other effects may be included.

It is to be noted that the present technology may be configured as follows.

(1)

A light-receiving device including:

a photoelectric conversion layer including a Group III-V semiconductor;

a plurality of first electrically-conductive type regions in which signal charges generated in the photoelectric conversion layer move; and a second electrically-conductive type region penetrating through the photoelectric conversion layer and provided between adjacent ones of the first electrically-conductive type regions.

(2)

The light-receiving device according to (1), in which the signal charges include holes.

(3)

The light-receiving device according to (1) or (2), in which the photoelectric conversion layer is of a second electrically-conductive type, and the second electrically-conductive type region has a higher concentration than the photoelectric conversion layer.

(4)

The light-receiving device according to (1), in which the photoelectric conversion layer is of a first electrically-conductive type.

(5)

The light-receiving device according to any one of (1) to (4), in which a wall-like insulating film is further provided in the photoelectric conversion layer.

(6)

The light-receiving device according to (5), in which a wall-like light-blocking structure is further provided in the photoelectric conversion layer.

(7)

The light-receiving device according to (6), which the light-blocking structure includes metal.

(8)

The light-receiving device according to (6), in which the insulating film is provided at a position in contact with the second electrically-conductive type region.

(9)

The light-receiving device according to any one of (1) to (5), in which a wall-like light-blocking structure is provided in the photoelectric conversion layer.

(10)

The light-receiving device according to any one of (1) to (9), in which the Group III-V semiconductor includes InGaAs.

(11)

The light-receiving device according to any one of (1) to (10), in which the second electrically-conductive type region includes a Group IV element or a Group VI element.

(12)

An imaging device including:
a photoelectric conversion layer provided common to a plurality of pixels and including a Group III-V semiconductor;
first electrically-conductive type regions each of which is provided for a corresponding one of the pixels, and in which signal charges generated in the photoelectric conversion layer move; and
a second electrically-conductive type region penetrating through the photoelectric conversion layer and provided between adjacent ones of the first electrically-conductive type regions.

(13)

An electronic apparatus provided with an imaging device, the imaging device including:
a photoelectric conversion layer provided common to a plurality of pixels and including a Group III-V semiconductor;
first electrically-conductive type regions each of which is provided for a corresponding one of the pixels, and in which signal charges generated in the photoelectric conversion layer move; and
a second electrically-conductive type region penetrating through the photoelectric conversion layer and provided between adjacent ones of the first electrically-conductive type regions.

(14)

A method of manufacturing a light-receiving device, the method including:
forming a photoelectric conversion layer including a Group III-V semiconductor;
forming a plurality of second electrically-conductive type regions penetrating through the photoelectric conversion layer; and
forming, between adjacent ones of the second electrically-conductive type regions, a first electrically-conductive type region in which signal charges generated in the photoelectric conversion layer move.

(15)

The method of manufacturing the light-receiving device according to (14), in which the second electrically-conductive type region is formed through forming a groove penetrating through the photoelectric conversion layer, and thereafter forming a diffusion source film in the groove.

(16)

The method of manufacturing the light-receiving device according to (14), in which the second electrically-conductive type region is formed through
forming a plurality of wall-like light-blocking structures,
forming a diffusion source film covering the plurality of the light-blocking structures, and
forming the photoelectric conversion layer between adjacent ones of the light-blocking structures, and thereafter performing heat treatment on the diffusion source film.

This application claims the benefits of Japanese Priority Patent Application No. 2016-171959 filed with the Japan Patent Office on Sep. 2, 2016, the entire contents of which are incorporated herein by reference.

It should be understood that those skilled in the art could conceive various modifications, combinations, sub-combinations, and alterations depending on design requirements and other factors, insofar as they are within the scope of the appended claims or the equivalents thereof.

What is claimed is:

1. A light-receiving device, comprising:
a photoelectric conversion layer including a Group III-V semiconductor;
a plurality of first electrically-conductive type regions in which signal charges generated in the photoelectric conversion layer move; and
a plurality of second electrically-conductive type regions, each second electrically-conductive type region penetrating through the photoelectric conversion layer and provided between adjacent ones of the first electrically-conductive type regions,
wherein each of the plurality of second electrically-conductive type regions includes:
a plurality of wall-like light-blocking structures; and
a diffusion source film covering the plurality of wall-like light-blocking structures,
wherein the photoelectric conversion layer is formed between adjacent ones of the wall-like light-blocking structures.

2. The light-receiving device according to claim 1, wherein the signal charges include holes.

3. The light-receiving device according to claim 1, wherein
the photoelectric conversion layer is of a second electrically-conductive type, and
the plurality of second electrically-conductive type regions have a higher concentration than the photoelectric conversion layer.

4. The light-receiving device according to claim 1, wherein the photoelectric conversion layer is of a first electrically-conductive type.

5. The light-receiving device according to claim 1, wherein a wall-like insulating film is further provided in the photoelectric conversion layer.

6. The light-receiving device according to claim 1, wherein the plurality of wall-like light-blocking structures include metal.

7. The light-receiving device according to claim 5, wherein the wall-like insulating film is provided at a position in contact with the each of the second electrically-conductive type regions.

8. The light-receiving device according to claim 1, wherein the Group III-V semiconductor includes InGaAs.

9. The light-receiving device according to claim 1, wherein the plurality of second electrically-conductive type regions include a Group IV element or a Group VI element.

10. An imaging device, comprising:
a photoelectric conversion layer provided common to a plurality of pixels and including a Group III-V semiconductor;
first electrically-conductive type regions each of which is provided for a corresponding one of the pixels, and in which signal charges generated in the photoelectric conversion layer move; and second electrically-conductive type regions, each second electrically-conductive type region penetrating through the photoelectric conversion layer and provided between adjacent ones of the first electrically-conductive type regions,
wherein each of the second electrically-conductive type regions includes:
a plurality of wall-like light-blocking structures; and
a diffusion source film covering the plurality of wall-like light-blocking structures,
wherein the photoelectric conversion layer is formed between adjacent ones of the wall-like light-blocking structures.

11. The imaging device according to claim 10, wherein a wall-like insulating film is further provided in the photoelectric conversion layer.

12. The imaging device according to claim 10, wherein the plurality of wall-like light-blocking structures include metal.

13. The imaging device according to claim 11, wherein the wall-like insulating film is provided at a position in contact with each of the second electrically-conductive type regions.

14. An electronic apparatus provided with an imaging device, the imaging device comprising:
a photoelectric conversion layer provided common to a plurality of pixels and including a Group III-V semiconductor;
first electrically-conductive type regions each of which is provided for a corresponding one of the pixels, and in which signal charges generated in the photoelectric conversion layer move; and
a second electrically-conductive type regions, each second electrically-conductive type region penetrating through the photoelectric conversion layer and provided between adjacent ones of the first electrically-conductive type regions,
wherein each of the second electrically-conductive type regions includes:
a plurality of wall-like light-blocking structures; and
a diffusion source film covering the plurality of wall-like light-blocking structures,
wherein the photoelectric conversion layer is formed between adjacent ones of the wall-like light-blocking structures.

15. The electronic apparatus according to claim 14, wherein a wall-like insulating film is further provided in the photoelectric conversion layer.

16. The electronic apparatus according to claim 14, wherein the plurality of wall-like light-blocking structures include metal.

17. The electronic apparatus according to claim 15, wherein the wall-like insulating film is provided at a position in contact with each of the second electrically-conductive type regions.

18. A method of manufacturing a light-receiving device, the method comprising:
forming a photoelectric conversion layer including a Group I-V semiconductor;
forming a plurality of second electrically-conductive type regions penetrating through the photoelectric conversion layer; and
forming, between adjacent ones of the second electrically-conductive type regions, a first electrically-conductive type region in which signal charges generated in the photoelectric conversion layer moves,
wherein each of the second electrically-conductive type regions is formed through:
forming a plurality of wall-like light-blocking structures,
forming a diffusion source film covering the plurality of wall-like light-blocking structures, and
forming the photoelectric conversion layer between adjacent ones of the wall-like light-blocking structures, and thereafter performing heat treatment on the diffusion source film.

19. The method of manufacturing the light-receiving device according to claim 18, wherein a wall-like insulating film is further provided in the photoelectric conversion layer.

20. The method of manufacturing the light-receiving device according to claim 18, wherein the plurality of wall-like light-blocking structures include metal.

* * * * *